SEMICONDUCTOR CONTROL APPARATUS

Filed Sept. 28, 1959

2 Sheets-Sheet 1

INVENTOR.

BALTHASAR H. PINCKAERS

BY Osmund R. Dahle

ATTORNEY

INVENTOR.
BALTHASAR H. PINCKAERS
BY Omund R. Dahle
ATTORNEY 3,065,388
SEMICONDUCTOR CONTROL APPARATUS
Balthasar H. Pinckaers, Edina, Minn., assignor to Minneapolis-Honeywell Regulator Company, Minneapolis, Minn., a corporation of Delaware
Filed Sept. 28, 1959, Ser. No. 842,748
17 Claims. (Cl. 317—148.5)

The present invention is concerned with condition responsive semiconductor control apparatus and is more particularly concerned with a new and improved bistable semiconductor switching apparatus for controlling a load device in response to a condition.

One of the difficulties encountered with semiconductor switching circuits in the past is that the circuit differential has been a function of transistor parameters, and as such the circuit differential greatly varied with changing transistor parameters caused by ambient temperature variations, aging of transistors, etc. Also the differential is not the same from one device to the next so that repeatability in production cannot be obtained. In the present invention, the switching differential is largely determined by the circuit parameters and not by the transistor parameters, and therefore in this improved circuit substantially no change in the differential occurs due to the varying temperature or changing transistors and the differential is substantially the same from device to device. This allows the construction of a control system having a narrow or small on-off differential yet maintaining operating stability.

The improved bistable circuit comprises a pair of regeneratively coupled transistors which are energized from a full-wave rectified but unfiltered A.C. source. By the use of the pulsating D.C. source it is possible to eliminate the large capacity electrolytic filter capacitors which have been a common cause of failure in transistor control systems, especially where the equipment is located in a relatively high ambient temperature area. The use of the pulsating D.C. supply permits accurate and rapid response, the bistable switching circuit making a switching decision twice per cycle of the A.C. supply.

It is an object of the invention to provide an improved semiconductor condition responsive switching apparatus in which the differential is substantially independent of the semiconductor parameters.

Another object of the invention is to provide a semiconductor switching circuit energized from a source of pulsating direct current in which the switching differential is independent of the semiconductor parameters.

These and other objects of the present invention will become more apparent upon a consideration of the claims, specification, and drawing, of which:

Figure 1:
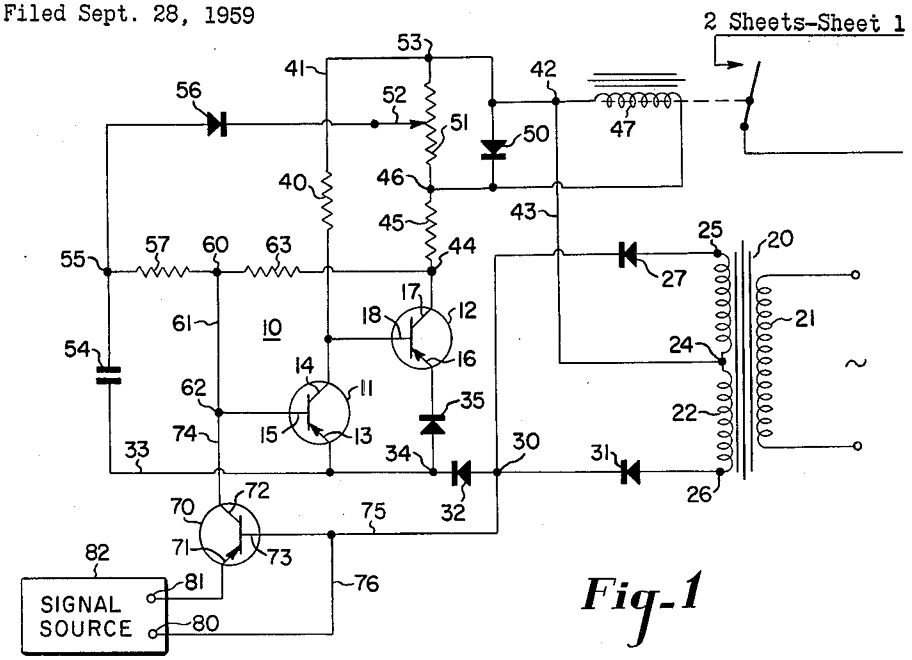
FIGURE 1 is a schematic circuit showing one embodiment of the invention.

Referring now to the drawing in which components are given the same identifying numeral in each of the figures, and referring especially to FIGURE 1, there is disclosed a snap-acting transistor amplifier switching circuit 10 comprising first and second semiconductor current controlling devices 11 and 12, here shown as junction-type transistors. The transistor 11 includes an emitter electrode 13, a collector electrode 14, and a control or base electrode 15. The transistor 12 includes an emitter electrode 16, a collector electrode 17 and a control or base electrode 18. The snap-acting circuit 10 is energized from a source of rectified, unfiltered potential which comprises a transformer 20 having a primary winding 21, and secondary winding 22. The secondary winding 22 is disclosed as being a center tapped winding having a center tap connection 24 and extremity connections 25 and 26. The terminal 25 is connected through a rectifying diode 27 to a junction 30, and the terminal 26 is connected through a similar rectifying diode 31 to the junction 30. When the primary winding 21 is energized by a suitable source of alternating current, not shown, a full-wave rectified pulsating potential appears between the junction 30 and the center tap connection 24, with the junction 30 being positive with respect to tap 24. Although the full-wave rectified supply is preferred, it may be possible under certain conditions to operate the apparatus with a half-wave supply.

The junction 30 is connected through a voltage pedestal here disclosed as rectifier 32, such as a silicon junction diode, and a conductor 33 to the emitter electrode 13 of the transistor 11. A junction 34 on the conductor 33 is also connected through a rectifier 35, which may be a silicon junction diode, to the emitter electrode 16 of transistor 12. The junction diodes 32 and 35 are effective to provide voltage pedestals for proper operation of the apparatus which will be discussed in greater detail below.

The collector electrode 14 of transistor 11 is directly connected to the control electrode 18 of transistor 12, and is also connected through a resistor 40, a conductor 41, a junction 42, and a conductor 43 to the center tap 24 of the secondary winding 22. The collector electrode 17 of the transistor 12 is connected by means of a junction 44, a resistor 45, a junction 46, a load relay winding 47, the junction 42, and the conductor 43 to the center tap 24. An asymmetric current conducting device 50 such as a silicon junction diode is connected in parallel with the relay winding 47. A voltage divider 51 is also connected in parallel with the relay winding 47 and the diode 50. The voltage divider 51 has an intermediate tap 52, which may be in the form of an adjustable wiper on the potentiometer, as shown. A circuit may also be traced from the conductor 33 through a capacitor 54, the junction 55, a rectifier 56, such as a semiconductor diode, and then to the intermediate tap 52 on the voltage divider 51. A current path may also be traced from the junction 55 through a resistor 57, a junction 60, a conductor 61, and a junction 62 to the control electrode 15 of transistor 11. A further bias path may be traced from the junction 44 of the collector electrode 17 from transistor 12 through a resistor 63, the junction 60, the conductor 61, and the junction 62 to the control electrode 15.

A third transistor 70 is connected in controlling relation to the snap-acting circuit 10. The transistor 70 includes an emitter electrode 71, a collector electrode 72, and a control electrode 73. The collector electrode 72 is directly connected by a conductor 74 and a junction 62 to the control electrode 15 of transistor 11. The control electrode 73 is directly connected by a conductor 75 to the junction 30, and by a conductor 76 to an output terminal 80 of a condition responsive D.C. signal source 82, which for example may be in the form of a D.C. bridge circuit. The other output terminal 81 of the source 82 is directly connected to the emitter electrode 71 of transistor 70. Under certain conditions the transistor 70 may be omitted and the signal from the bridge circuit be connected directly to the transistor 11.

*Operation of FIGURE 1*

In discussing the operation of the circuit, consideration will be given to the operation of the transistor switching circuit 10. Let it be assumed in the initial consideration of the circuit that the signal source circuit 82 is providing no signal output to the transistor 70, whereby the transistor 70 is relatively nonconductive and presents a high impedance between control electrode 73 and collector electrode 72.

As was mentioned above, the secondary winding 22 and the rectifiers 27 and 31 provide a full-wave rectified pulsating D.C. potential between the junction 30 and the center tap connection 24. Commencing from the positive junction 30 a current path may be traced through the junction diode 32, the conductor 33, through the capacitor 54 to charge the capacitor, through diode 56 to the wiper contact 52 of potentiometer 51, through the upper portion of the resistance element of potentiometer 51 to junction 53, and then through conductors 41 and 43 to the negative center tap connection 24. This circuit is effective during each half-cycle to charge the capacitor 54 substantially to the peak voltage on winding 22. A long time constant discharging circuit for the capacitor 54 may be traced from the positive plate of the capacitor through the conductor 33 to emitter 13, through the transistor 11 from emitter 13 to control electrode 15, and through the resistor 57 to the less positive plate of the capacitor 54. A relatively constant D.C. bias current is thus provided to transistor 11. It is clear that this D.C. bias current exists at all times even when the pulsating D.C. potential between junction 30 and center tap connection 24 periodically goes through (or to) zero. Therefore transistor 11 is predisposed to conduct from emitter to collector whenever the supply voltage returns (starting from zero), so that under the no signal conditions assumed transistor 11 starts to conduct from emitter 13 to collector 14 to the fullest possible extent, as permitted by instantaneous supply voltage and resistance of resistor 40, every time the supply voltage starts to increase from zero (twice per A.C. cycle). With transistor 11 thus conductive the voltage drop, saturation voltage, from emitter 13 to collector 14 is very low, lower than the voltage necessary to start forward conduction through silicon diode 35. Therefore no emitter to base current can flow in transistor 12 with the result that transistor 12 remains nonconductive. With no collector current flowing in transistor 12, the relay 47 is unenergized and junction 44 has nearly the same negative potential as the center tap 24. This voltage is increasing in step with the increasing supply voltage which causes an increasing current to flow from junction 30, diode 32, conductor 33, through emitter 13 of transistor 11, out of control electrode 15, junction 62, conductor 61 through resistor 63 to junction 44. This constitutes a further bias current, of a time-variant nature, for transistor 11. This pulsating bias current can be and is made more than sufficient to continue to hold transistor 11 saturated (very low voltage from emitter to collector) during the remainder of the half-cycle. Consequently transistor 12 remains nonconductive during the half-cycle under consideration. Approximately in the middle of the half-cycle, capacitor 54 is charged through diode 56 and the upper half of the potentiometer 51. Because transistor 12 remains nonconductive and the current through resistor 63 is relatively low, the capacitor 54 is substantially charged to the peak voltage on winding 22 as noted before. It is clear from the above that the function of the D.C. bias current derived from capacitor 54 is mainly effective only during the beginning of each half-cycle of the supply voltage. This current determines in conjunction with the input current in conductor 74 which comes from collector 72 of transistor 70 (presently assumed to be zero) whether or not transistor 11 is sufficiently conductive to keep transistor 12 biased nonconductive when the voltage starts to increase from zero. If at that time transistor 11 is sufficiently conductive it will remain so for the rest of the half-cycle through the action of the regenerative feedback path including resistor 63, as explained above. It can be seen that the silicon junction diode 35 connected in the emitter circuit of transistor 12 provides in effect a voltage pedestal to insure not only that no bias current will flow to and out of control electrode 18, but that actually some current may flow from collector 14 of transistor 11 into the base or control electrode 18 of transistor 12 to provide the base-to-collector junction leakage current of transistor 12 and thus to insure that transistor 12 is shut-off substantially to the relatively low collector saturation current (nonamplified leakage current).

Let us now consider the operation of the circuit when an electrical unbalance occurs in the bridge to provide a D.C. potential of a magnitude proportional to the unbalance of the bridge. The potential causes a current to flow through the input circuit of transistor 70 from emitter 71 to control electrode 73. The resistance of the output circuit of the transistor 70, that is, the resistance between control electrode 73 and collector electrode 72 is an inverse function of the magnitude of the signal from the condition responsive bridge.

One way of expressing the effect of the conductivity of transistor 70 is that it provides a shunt across the input circuit of transistor 11. A preferred explanation, however, is that the transistor 70 operates as a current source which provides a reverse bias current into the control electrode 15 of transistor 11 to oppose the bias current from capacitor 54, above described. The voltage for the current source is principally provided by the voltage across diode 32 through which all current for the switching circuit must pass.

As the output signal of the signal source increases, a point is reached at which the reverse bias current flowing through transistor 70 is sufficient with respect to the bias current flowing due to the charge on capacitor 54, that the net bias current (algebraic difference between these two currents) is insufficient to keep transistor 11 sufficiently conductive at the start (increasing from zero) of the half-wave of the supply voltage to completely bias off transistor 12. As the voltage starts to increase, therefore, some emitter to base current flows in transistor 12 allowing some collector current to flow out of collector 17 through resistor 45 and the parallel combination of relay coil and potentiometer 51 to center tap 24. Therefore the voltage of junction 44 is no longer substantially the same as that of tap 24, and the current through resistor 63 is not sufficient to keep transistor 11 conductive. That is to say, as the half cycle progresses the lack of bias or insufficiency of bias for transistor 11 tends to increase. This puts transistor 12 into further conduction and because of the feedback mechanism through resistor 63, transistor 12 goes into full conduction which takes away practically all auxiliary or half-wave bias from transistor 11. This action occurs rapidly as the supply voltage increases above the necessary "cracking" voltage of silicon diodes 32 and 35. Now transistor 12 is fully on for the half-cycle under consideration. Theoretically it should come "on" again at the beginning of the next cycle but to prevent small periodic input voltage variations, such as a ripple component, from allowing load energization during one half-cycle and not during the succeeding half-cycle, a differential is provided. This is accomplished by the fact that when transistor 12 is "on" the potential available to charge capacitor 54 is reduced. Therefore the capacitor voltage and associated bias current for transistor 11 will be less at the beginning of the succeeding half-cycle than it was at the beginning of the first "on" half-cycle.

In other words, it will be noted that with the transistor 12 conductive and the relay 47 energized, the capacitor 54 can no longer be charged to as large a voltage as previously was the case with the relay deenergized. This is due to the fact that the capacitor is connected to the wiper 52 of the voltage divider 51. With the relay winding 47 energized, a large potential also exists across the voltage divider allowing the differential in potential on capacitor 54 to be determined by the setting of the wiper 52. The resulting reduction in charge on capacitor 54 results in a smaller bias current flowing through the transistor 11 and resistor 57. The effect is that once a signal from the bridge 82 becomes large enough to switch the circuit 10 for one half-cycle, the circuit 10 will continue to remain in switched position during each successive half-cycle, the signal current remaining constant.

As can be seen, therefore, regardless of whether or not the load is energized, the switching circuit "decides" near the start of each half-cycle of the supply voltage whether transistor 11 will come "on" sufficiently, and consequently keep transistor 12 cut off, or whether transistor 12 will come "on." This decision is made in accordance with the net D.C. bias conditions existing at that time on the base-emitter circuit of transistor 11.

Figure 3:
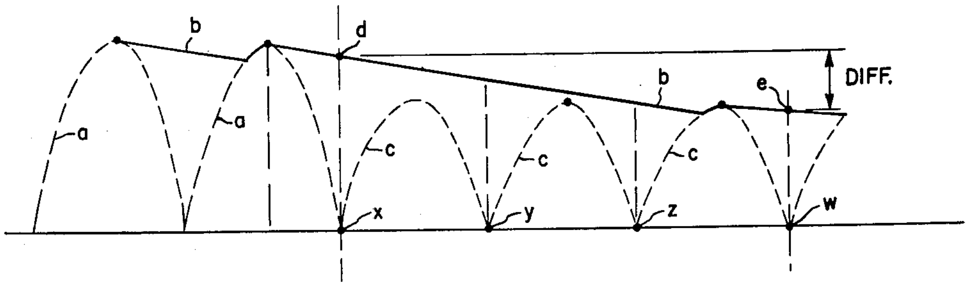
FIGURE 3 is a graphic representation of the operating characteristics of the circuit of FIGURE 1.

This is shown graphically in FIGURE 3 in which the waveform *a* represents the magnitude of potential available to charge capacitor 54 prior to the time the load is energized the first time, the waveform *b* representing the voltage on the capacitor 54. Assuming that at point X the load is energized the first time, the waveform *c* is representative of the voltage available thereafter to charge the capacitor 54.

In the present invention, a switching decision is made every half-cycle immediately after each supply potential pulsation null point, in other words, just as the supply potential pulsations are beginning to increase from zero. Thus it is assumed in the illustration of FIGURE 3 that at time point X the signal from the signal source 82 has become large enough with respect to the bias current curve *b* at point *d* to cause switching of the circuit and energizing of the load. The switching decision is also made at points Y and Z and assuming the signal has not reduced the load continues to be energized. The difference in magnitude between points *d* and *e* on the curve *b* represents the pull-in drop-out differential of the circuit. In other words, the load will continue to remain energized until the signal from the bridge has reduced to a magnitude less than point *e* of FIGURE 3. When the signal drops below point *e*, transistor 11 again becomes conductive maintaining transistor 12 cut off thereby de-energizing the load relay, and the charge on the capacitor 54 again increases to its initial value. The diode 50 is effective to absorb the inductive transients from relay 47. The diode 56 prevents any current flow back through the charging path of capacitor 54.

FIGURE 2

Figure 2:
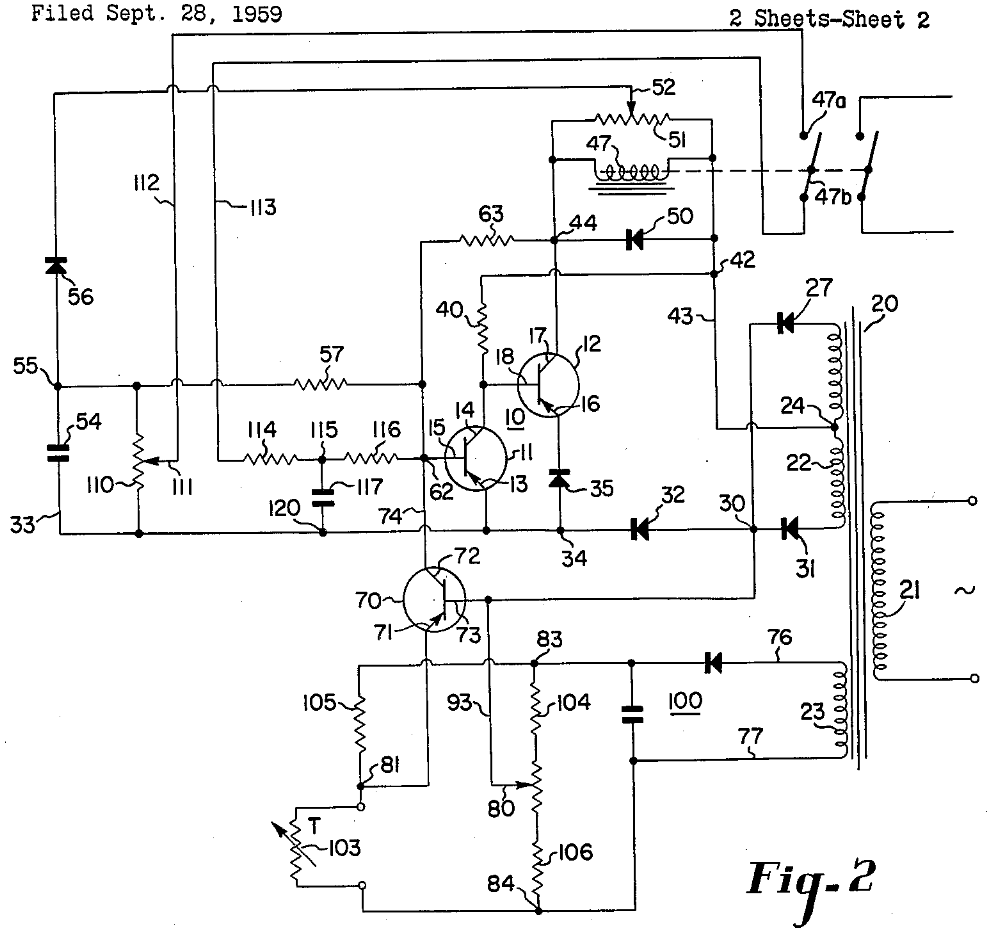
FIGURE 2 is a schematic representation of another embodiment of the invention.

The circuit of FIGURE 2 is a slight modification of FIGURE 1 in that it is shown as being adapted for use as a temperature control system. The bridge circuit is modified to show a temperature responsive resistive bridge energized from a direct current source. In addition, a pair of out contacts on the load relay provide a long time constant RC circuit which is energized upon actuation of the relay to change the bias of the first stage of the transistor switch and partially offset the effect of the signal from the sensing bridge, as will be discussed in greater detail below.

The discussion below will be limited mainly to the differences in the circuit of FIGURE 2, with like components carrying the same identifying numerals as in FIGURE 1. The output of winding 23 of the power transformer 20 is connected through a conventional rectifier and filter 100, here shown as a junction diode rectifier and a capacitor. The resultant D.C. potential is applied to bridge input terminals 83 and 84. The bridge legs are shown as being resistive and including a temperature sensitive resistive element 103 and fixed legs 104, 105 and 106. The output terminals of the bridge are identified as 81 and 80 with terminal 81 being directly connected to the emitter electrode 71 of transistor 70 and with terminal 80 being connected by the conductor 93 to the control electrode 73 of transistor 70.

A potentiometer 110 is connected in parallel with the capacitor 54. An adjustable wiper contact 111 on the potentiometer is connected by conductor 112 to a fixed contact 47*a* on relay 47. A normally open movable contact 47*b*, which when the relay is energized makes contact with 47*a*, is connected through a conductor 113, a resistor 114, a junction 115, a resistor 116, and the junction 62 to the control electrode 15 of transistor 11. A capacitor 117 connects the junction 115 to the conductor 33 at a junction 120.

In considering the operation of the circuit of FIGURE 2, most of the comments made above in regard to the operation of FIGURE 1 are also applicable to FIGURE 2. Thus, when a temperature change occurs in the area sensed by the temperature responsive element 103, the bridge circuit becomes unbalanced to provide an output signal between terminals 80 and 81. When this unbalance becomes sufficiently large, the switching circuit 10 is operated to energize the load relay 47. The circuit also includes a bias adjusting circuit actuated by the normally open contacts 47*a* and *b* of relay 47. This circuit acts to provide a type of cycler action without placing the cycler element into the bridge circuit.

The resistance 114 and capacitor 117 are chosen to provide an RC time constant which may be in the order of 120 seconds. Thus upon the relay being energized, the potential at wiper 111 of potentiometer 110 flows through the switch contacts 47*a* and 47*b* and through resistor 114 to charge the capacitor 117. The ramp type voltage on capacitor 117 is fed through the resistor 116 to partially offset the bias effect of the signal from the bridge and upon the signal from capacitor 117 becoming large enough, the switching differential of the circuit is reached and the relay is de-energized even though the signal from the sensing bridge remains unchanged. The energy stored in the timing circuit then decays allowing subsequent re-energization of the load.

*FIGURE 4*

Figure 4:
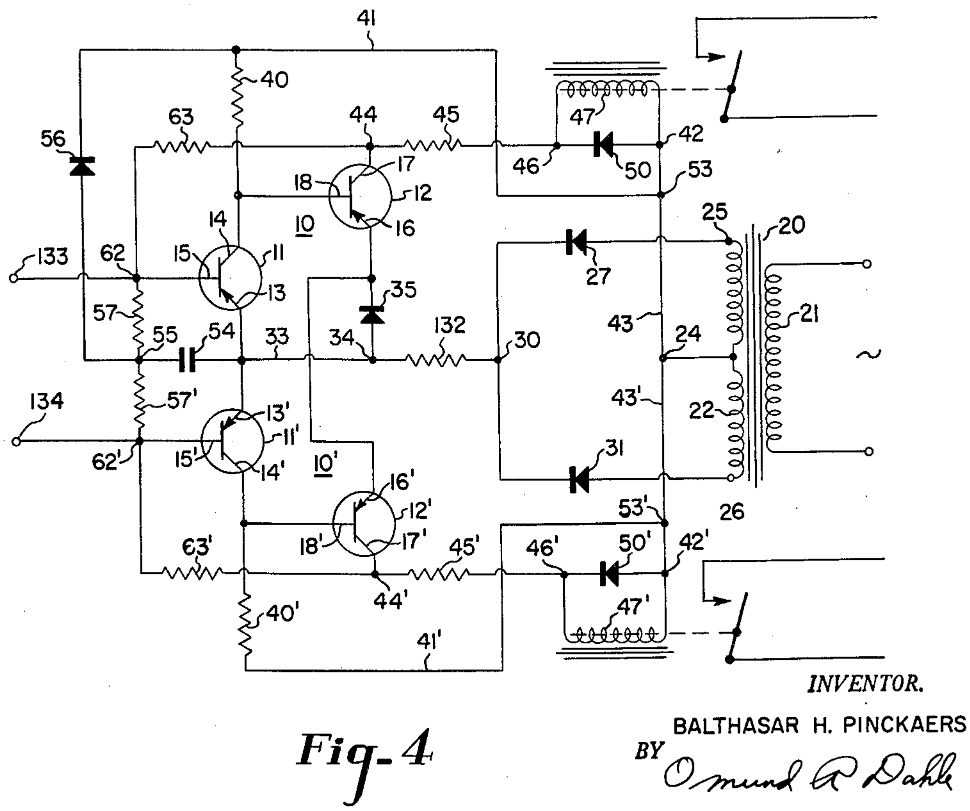
FIGURE 4 is a modification of FIGURE 1.

The control device of FIGURE 4 is a modification of FIGURE 1 to provide for a two relay switching circuit for motor control applications and the like. The device is adapted to accept reversible polarity D.C. input current signals to actuate one or the other of the two relays dependent upon the polarity of the signal. The upper portion of FIGURE 4 has identifying numerals corresponding to FIGURE 1 and the lower portion of the figure uses primed numbers. The following discussion will be limited primarily to the components not found in FIGURE 1.

It can be seen by a brief study of FIGURE 4 that the lower portion of the circuit bearing the primed identifying numerals is substantially a mirror image of the upper portion. The voltage pedestal diode 32 is replaced by a resistor 132 between the positive terminal 30 of the rectifier and conductor 33. The resistor 132 provides the differential, and the potentiometer 51 is eliminated and diode 56 is connected directly to conductor 41 and thus to center tap 24. The capacitor 54 is common to both relay circuits of FIGURE 4 and provides a bias to the transistors 11 and 11' through the resistors 57 and 57'. The voltage pedestal diode 35 is common to the emitter circuit of both transistors 12 and 12'. Signal input terminals 133 and 134 are directly connected to base electrodes 15 and 15' of transistors 11 and 11'. In operation both relay switching circuits 10 and 10' are normally de-energized. A signal making terminal 133 positive with respect to 134 causes switching circuit 10 to be actuated energizing relay 47 and a reverse polarity signal actuates switching circuit 10'. As mentioned previously, the resistor 132 provides the operating differential. Normally, with neither switch 10 nor 10' in the "on" condition, the potential drop across resistor 132 is relatively small and capacitor 54 is charged to a relatively high value. When one of the switches is actuated, switch 10 for example, the load current flowing through transistor 12 causes a substantially larger potential to exist across resistor 132 thereby reducing the potential to which capacitor 54 is charged.

In general, while I have shown certain specific embodiments of my invention, it is to be understood that this is for the purposes of illustration and that my invention is to be limited solely by the scope of the appended claims.

I claim:

1. Bistable current controlling apparatus energized from an unfiltered rectified alternating current supply comprising: normally nonconductive bistable switching means including a switching circuit and a control element and being operable to a conductive condition by a predetermined level of signal; a source of alternating power; rectifier means energized from said alternating power for providing an unfiltered pulsating direct current output; impedance load means; circuit means including said switching circuit connecting said load means to said pulsating direct current so that upon said switching means becoming conductive said load means is energized; a source of variable signal current connected to said control element for operating said switching means to the conductive condition upon said predetermined signal level being reached; circuit means connected to said bistable switching means and responsive to the energization of said load means to modify said predetermined signal level required for switching said bistable means on the subsequent direct current power pulsation to thereby provide an operating differential.

2. Bistable switching apparatus controlling the application of power to a load from an unfiltered rectified alternating current supply, the switching apparatus being adapted to make a switching decision at the leading edge of each cyclic current pulsation comprising: bistable switching means including a pair of switching terminals and a control terminal; relay load means; circuit means comprising said switching terminals connecting said relay means to a pulsating rectified alternating current supply; biasing means connected to said switching means to cause said switching means to make a nonconductive decision with each current pulsation in the absence of a predetermined magnitude of signal; further circuit means connecting said control electrode to a variable source of signal, said signal being effective upon reaching a predetermined magnitude to switch said bistable means to a conductive condition at the initiation of the succeeding current pulsation; and means for modifying said predetermined magnitude connected to said switching means and responsive to the energization of said relay means to thereupon reduce the predetermined signal magnitude required for switching on subsequent power pulsations.

3. Semiconductor switching apparatus controlling the application of power to a load from an unfiltered rectified alternating current voltage supply, the switching apparatus being adapted to make a switching decision in response to a direct current signal at the leading edge of each cyclic power pulsation comprising: a source of pulsating rectified power; semiconductor switching means energized from said source and having a plurality of electrodes including a pair of switching electrodes and a control electrode and being operable to a conductive condition by a predetermined level of signal, the switching decision being made at the beginning of each voltage pulsation; relay load means; circuit means comprising said switching electrodes connecting said relay means to said pulsating rectified supply; biasing means connected to said switching means to cause said switching means to make a nonconductive switching decision with each power pulsation in the absence of a predetermined magnitude of signal; further circuit means connecting said control electrode to a direct current signal, said signal being effective upon reaching a predetermined magnitude to switch said semiconductor means to a conductive condition; and means for modifying said biasing means connected to said switching means and responsive to the energization of said relay means to thereupon reduce the signal magnitude required for switching on subsequent power pulsations.

4. Bistable switching apparatus energized by a source of pulsating current comprising: bistable switching means including semiconductor current controlling means having a plurality of electrodes including a power output electrode, a power input electrode and a control electrode, and regenerative feedback means connected from said output electrode to said control electrode; relay means connecting the output electrode of said semiconductor means to a reference potential point; a source of pulsating direct current having one terminal connected to said point and the second terminal connected to said power input electrode; bias current means connected to said control electrode for normally maintaining said bistable switch in the non-conductive condition, comprising resistive-capacitive means, said capacitor means being connected to said source and charged by said source to a first level when said relay is deenergized and to a lesser level when energized to provide a differential in the bias current magnitude when the relay is energized; and a signal current source connected to said control electrode for actuating said bistable switch to a conductive condition.

5. Bistable semiconductor current controlling apparatus controlling the application of power from an unfiltered rectified alternating current supply to a load comprising: normally nonconductive bistable semiconductor switching means having a plurality of electrodes including first and second switching electrodes and a control electrode; a source of alternating power; rectifier means energized from said alternating power for providing an unfiltered pulsating direct current output; impedance load means; circuit means comprising said switching electrodes connecting said load means to said pulsating direct current; means connecting said control electrode to a source of signal of variable magnitude for operating said switching means to the conductive condition upon a predetermined signal level being reached; and switching differential means connected to said switching means and responsive to the energization of said load means so that upon energization of said load means, the predetermined signal level is reduced whereby the signal level required for switching said bistable means on the subsequent direct current power pulsation is reduced to thereby provide a stable operating differential.

6. Bistable semiconductor current controlling apparatus energized from an unfiltered rectified alternating current supply comprising: normally nonconductive bistable semiconductor switching means having a plurality of electrodes including first and second switching electrodes and a control electrode and being operable to a conductive condition by a predetermined level of signal; a source of alternating power; rectifier means energized from said alternating power for providing a pulsating direct current output; relay load means; circuit means including said switching electrodes connecting said load means to said pulsating direct current so that upon said switching means becoming conductive said load means is energized; a source of variable signal current connected to said control electrode for operating said switching means to the conductive condition upon said predetermined signal level being reached; and further circuit means connected to said bistable switching means and responsive to the energization of said load means to modify said predetermined signal level required for switching said bistable means on the subsequent direct current power pulsation to thereby provide an operating differential.

7. Bistable current controlling apparatus controlling the application of power from an unfiltered rectified alternating current supply to a load comprising: normally nonconductive bistable switching means including first and second switching terminals and a control element; a source of alternating power; rectifier means energized from said alternating power for providing an unfiltered pulsating direct current output; impedance load means; circuit means connecting said switching terminals and said load means in a series circuit to said pulsating direct current output; voltage divider impedance means connected in parallel with said load means; further circuit means connecting said control element to a source of signal of variable magnitude for operating said switching means to the conductive condition upon a predetermined signal level being reached; and capacitor means connected intermediate a point on said voltage divider means and said rectified source to be charged therefrom, said capacitor means thereby being charged to a first direct current potential when said load means is de-energized and to a lesser potential when energized, the charge on said capacitor means being applied as a differential bias connected to said switching means control element and responsive to the energization of said load means so that upon energization of said load means, the predetermined signal level is reduced whereby the signal level required for switching said bistable means on the subsequent direct current power pulsating is reduced to thereby provide a stable operating differential.

8. Bistable current controlling apparatus controlling the application of power from an unfiltered rectified alternating current supply to a load comprising: a source of alternating power; rectifier means energized from said alternating power for providing an unfiltered pulsating direct current output supply; normally nonconductive bistable switching means including switching terminals and a control element, said switching means being sensitive to a predetermined level of signal during the rise time of potential applied to said switching means control element and being relatively insensitive to signals during the remainder of the cycle; circuit means connecting said pulsating direct current supply through said switching terminals to terminals of load means to be energized; voltage divider impedance means connected in parallel with said load means terminals; further circuit means connecting said control element to a source of signal of variable magnitude for operating said switching means to the conductive condition upon said predetermined signal level being reached; and capacitor means connected intermediate a point on said voltage divider means and said rectified source to be charged therefrom, said capacitor means thereby being charged to a first direct current potential when said load means is deenergized and to a lesser potential when energized, the charge on said capacitor means being applied as a differential bias connected to said switching means control electrode and responsive to the energization of said load means so that upon energization of said load means, the predetermined signal level is reduced whereby the signal level required for switching said bistable means on the subsequent direct current power pulsation is reduced to thereby provide a stable operating differential.

9. Bistable semiconductor current controlling apparatus controlling the application of power from an unfiltered rectified alternating current supply to a load comprising: normally nonconductive bistable semiconductor switching means having a plurality of electrodes including first and second switching electrodes and a control electrode; a source of alternating power; rectifier means energized from said alternating power for providing an unfiltered pulsating direct current output; impedance load means; circuit means connecting said switching electrodes and said load means in a series circuit to said pulsating direct current; voltage divider impedance means connected in parallel with said load means; further circuit means connecting said control electrode to a source of signal of variable magnitude for operating said switching means to the conductive condition upon a predetermined signal level being reached; and capacitor means connected intermediate a point on said voltage divider means and said pulsating direct current to be charged thereform, said capacitor means thereby being charged to a first direct current potential when said load means is deenergized and to a lesser potential when energized, the charge on said capacitor means being applied as a differential bias connected to said switching means control electrode and responsive to the energization of said load means so that upon energization of said load means, the predetermined signal level is reduced whereby the signal level required for switching said bistable means on the subsequent direct current power pulsation is reduced to thereby provide a stable operating differential.

10. Semiconductor bistable switching apparatus energized by a source of pulsating direct current comprising: a bistable switch including first and second semiconductor current controlling means each having a plurality of electrodes including an output electrode, an input electrode and a control electrode; load relay means connecting the output electrode of said second semiconductor means to a reference potential point, said relay means being energized upon the conduction of said second semiconductor means; a source of pulsating direct current having one terminal connected to said point and the second terminal connected to said input electrodes; means directly connecting the output electrode of said first semiconductor means to the control electrode of said second semiconductor means; impedance means connecting said first semiconductor means output electrode to said reference potential point; regenerative feedback means connected from said second semiconductor means output electrode to said first semiconductor control electrode; bias current means connected to the control electrode of said first semiconductor means for normally maintaining said first semiconductor means conductive and thereby maintaining said second semiconductor means nonconductive comprising resistive-capacitive means, said capacitive means being connected to said source and charged by said source to a first level when said load relay means is deenergized and charged to a lesser level when said relay means is energized to provide a differential reduction in the bias current and thus in the switching current required when the relay means is energized; and a signal current source connected to said first transistor control electrode for actuating said bistable switch.

11. Transistor bistable switching apparatus energized by a source of pulsating current comprising: a bistable switch including first and second transistors each having a plurality of electrodes including an output electrode, an input electrode and a control electrode; relay means connecting the output electrode of said second transistor to a reference potential point; a source of pulsating direct current having one terminal connected to said point and the second terminal connected to said input electrodes; means directly connecting the output electrode of said first transistor to the control electrode of said second transistor; impedance means connecting said first transistor output electrode to said reference potential point; regenerative feedback means connected from said second transistor output electrode to said first transistor control electrode; bias current means connected to the control electrode of said first transistor for normally maintaining said first transistor conductive and thereby maintaining said second transistor nonconductive comprising resistive-capacitive means, said capacitive means being connected to said source and charged by said source to a first level when said relay is deenergized and to a lesser level when energized to provide a differential in the bias current; and a signal current source connected to said first transistor control electrode for actuating said bistable switch.

12. Bistable semiconductor current controlling apparatus energized from an unfiltered rectified alternating current supply comprising: normally nonconductive bistable semiconductor switching means having a plurality of electrodes including first and second switching electrodes and a control electrode; a source of alternating power; rectifier means energized from said alternating power for providing a pulsating direct current output; impedance load means; circuit means including said switching electrodes connecting said load means to said pulsating direct current; bias current producing means energized to provide a first level of bias when said load means is unenergized and to provide a lesser bias upon energization of said load means, said bias means supplying a bias current to said switching means control electrode in a direction to tend to maintain said switching means in the non-conductive condition; a source of variable signal current connected to said control electrode and opposing said bias current for operating said switching means to the conductive condition upon a predetermined signal level being reached, so that upon energization of said load means the bias current is reduced whereby the signal level required for switching said bistable means on the subsequent direct current power pulsation is reduced to thereby provide an operating differential.

13. Bistable semiconductor switching apparatus controlling the application of power to a load in response to a condition, the switching apparatus providing a minute but stable switching differential comprising: normally nonconductive bistable semiconductor switching means having a plurality of electrodes including a pair of switching electrodes and a control electrode; relay load means; circuit means series connecting said switching electrodes and said load means to said pulsating rectified supply; capacitive-resistive current producing biasing means connected to said switching means control electrode to cause said switching means to revert to a nonconductive condition with each power pulsation in the absence of a predetermined magnitude of signal; further circuit means connecting said control electrode to a variable source of signal, said signal being effective upon reaching a predetermined magnitude to switch said bistable means to a conductive condition; and bias modifying means connected to said switching means and responsive to the energization of said relay means to thereupon reduced said predetermined magnitude of signal required for switching to said conductive condition on subsequent power pulsations.

14. Bistable semiconductor switching apparatus controlling the application of power to a load from an unfiltered rectified alternating current supply, the switching apparatus being adapted to make a switching decision at the leading edge of each cyclic power pulsation based on the presence or absence of a predetermined magnitude of signal comprising: bistable semiconductor switching means having a plurality of electrodes including a pair of switching electrodes and a control electrode; relay load means; circuit means comprising said switching electrodes connecting said relay means to said pulsating rectified supply; biasing means connected to said switching means to cause said switching means to make a nonconductive decision with each power pulsation in the absence of a predetermined magnitude of signal at said control electrode; circuit means connecting said control electrode to a variable source of signal, said signal being effective upon reaching a predetermined magnitude to switch said bistable means to a conductive condition; and means connected to said switching means and responsive to the energization of said relay means to thereupon reduce said predetermined magnitude of signal required for switching to said conductive condition on subsequent power pulsations.

15. Condition control switching apparatus comprising: condition responsive signal producing means adapted to provide an output signal indicative of a condition being sensed; normally nonconductive bistable switching means for controlling the application of power from a pulsating direct current source to load means, said switching means being operable by a predetermined level of signal from said normally nonconductive state to a conductive state to energize said load means; and further signal producing means energized in response to energization of said load means to provide a gradually varying signal to said bistable switching means to partially offset the effect of the signal from said condition sensing means whereby said switching means becomes deenergized even though said signal exceeds said predetermined magnitude.

16. Condition control switching apparatus comprising: condition responsive signal producing means adapted to provide a first signal having a magnitude indicative of a condition being sensed; semiconductor switching means for controlling the application of power from a pulsating direct current source to load means, said switching means being operable by a predetermined level of signal from one to the other of a nonconductive state and a conductive state to control energization of said load means; and further signal producing means energized in response to energization of said load means to provide a time varying signal to said switching means to partially offset the effect of the first signal from said condition sensing means whereby said switching means reverts and said load means becomes deenergized even though said first signal exceeds said predetermined magnitude.

17. Condition control apparatus comprising: condition responsive signal producing means adapted to provide a first signal having a magnitude indicative of a condition being sensed; semiconductor current controlling means having a control circuit and having output electrodes connected for controlling the application of power from a pulsating direct current source to load means, said semiconductor means being operable by a predetermined level of signal from one to the other of a relatively nonconductive state and a relatively conductive state to control energization of said load means; and further signal producing means energized in response to energization of said load means to provide a time varying further signal to said semiconductor means control circuit to increasingly with time offset the effect of the first signal from said condition sensing means whereby after a time said load means becomes deenergized even though said first signal still exceeds said predetermined magnitude.

References Cited in the file of this patent

UNITED STATES PATENTS

| | | |
|---|---|---|
| 2,718,612 | Willis | Sept. 20, 1955 |
| 2,759,124 | Willis | Aug. 14, 1956 |
| 2,876,395 | Miller | Mar. 3, 1959 |